United States Patent
Yamada

(10) Patent No.: US 11,871,549 B2
(45) Date of Patent: Jan. 9, 2024

(54) HEAT CONDUCTION MECHANISM

(71) Applicant: SONY GROUP CORPORATION, Tokyo (JP)

(72) Inventor: Hiroto Yamada, Tokyo (JP)

(73) Assignee: SONY GROUP CORPORATION, Tokyo (JP)

(*) Notice: Subject to any disclaimer, the term of this patent is extended or adjusted under 35 U.S.C. 154(b) by 156 days.

(21) Appl. No.: 17/608,941

(22) PCT Filed: May 8, 2020

(86) PCT No.: PCT/JP2020/018739
§ 371 (c)(1),
(2) Date: Nov. 4, 2021

(87) PCT Pub. No.: WO2020/230745
PCT Pub. Date: Nov. 19, 2020

(65) Prior Publication Data
US 2022/0256745 A1    Aug. 11, 2022

(30) Foreign Application Priority Data
May 16, 2019 (JP) .................. 2019-093092

(51) Int. Cl.
*H05K 7/20* (2006.01)
*G06F 1/20* (2006.01)
(Continued)

(52) U.S. Cl.
CPC ......... *H05K 7/20963* (2013.01); *G06F 1/163* (2013.01); *G06F 1/206* (2013.01); *H05K 7/2049* (2013.01); *H04N 23/52* (2023.01)

(58) Field of Classification Search
CPC .. H05K 7/20963; H05K 7/2049; G06F 1/163; G06F 1/206; H04N 23/52
See application file for complete search history.

(56) References Cited

U.S. PATENT DOCUMENTS 5,646,822 A * 7/1997 Bhatia .................. F28D 15/02
361/679.52
5,796,581 A * 8/1998 Mok ...................... G06F 1/203
361/679.52
(Continued)

FOREIGN PATENT DOCUMENTS

CN    101594769 A    12/2009
CN    102954843 A    3/2013
(Continued)

OTHER PUBLICATIONS

International Search Report and Written Opinion of PCT Application No. PCT/JP2020/018739, dated Aug. 11, 2020, 09 pages of ISRWO.

*Primary Examiner* — Michael A Matey
(74) *Attorney, Agent, or Firm* — CHIP LAW GROUP

(57) ABSTRACT

Provided is a heat conduction mechanism including: a first member including at least one heat source; a second member including a heat dissipation element, the second member displaceable with respect to the first member; and a heat conductive sheet that transfers heat of the heat source to the heat dissipation element, in which a protective sheet is provided to a portion of the heat conductive sheet that can be in contact with at least a part of the first member or the second member.

13 Claims, 11 Drawing Sheets

(51) Int. Cl.
*G06F 1/16* (2006.01)
*H04N 23/52* (2023.01)

(56) References Cited

U.S. PATENT DOCUMENTS

| | | | | |
|---|---|---|---|---|
| 5,847,925 A * | 12/1998 | Progl | ................. | G06F 1/203 |
| | | | | 361/679.52 |
| 5,910,883 A * | 6/1999 | Cipolla | ............... | F28D 15/0233 |
| | | | | 361/679.52 |
| 6,069,791 A * | 5/2000 | Goto | ................. | G06F 1/203 |
| | | | | 361/679.55 |
| 6,075,696 A * | 6/2000 | Progl | ................. | G06F 1/203 |
| | | | | 361/679.52 |
| 6,097,596 A * | 8/2000 | Cipolla | ............... | G06F 1/203 |
| | | | | 361/679.55 |
| 6,175,493 B1 * | 1/2001 | Gold | ................. | G06F 1/203 |
| | | | | 361/679.55 |
| 7,969,739 B2 * | 6/2011 | Tsunoda | ............ | G06F 1/203 |
| | | | | 361/704 |
| 8,964,377 B2 * | 2/2015 | Choi | ................. | G06F 1/1681 |
| | | | | 361/679.55 |
| 10,551,886 B1 * | 2/2020 | de la Fuente | ...... | H05K 7/20963 |
| 10,932,393 B2 * | 2/2021 | Paavola | ............ | F28D 15/0208 |
| 11,272,639 B2 * | 3/2022 | Yang | ................. | G06F 1/203 |
| 2006/0262500 A1 * | 11/2006 | Huang | ............... | G06F 1/203 |
| | | | | 361/720 |
| 2008/0130221 A1 * | 6/2008 | Varadarajan | ....... | G06F 1/203 |
| | | | | 361/679.52 |
| 2009/0071632 A1 * | 3/2009 | Bryant | ............... | F28D 15/04 |
| | | | | 165/104.26 |
| 2009/0229808 A1 * | 9/2009 | Chu | ................. | H05K 7/2049 |
| | | | | 165/185 |
| 2009/0290310 A1 | 11/2009 | Kontani | | |
| 2009/0296350 A1 * | 12/2009 | Oki | ................. | G02B 6/4269 |
| | | | | 361/709 |
| 2011/0199718 A1 * | 8/2011 | Stone | ............... | H04M 1/0237 |
| | | | | 361/679.01 |
| 2013/0037533 A1 | 2/2013 | Namekawa et al. | | |
| 2015/0119111 A1 * | 4/2015 | Honmura | ............ | F28D 15/046 |
| | | | | 455/566 |
| 2016/0259271 A1 * | 9/2016 | Ooyoshi | ............ | G03G 15/0817 |
| 2017/0006738 A1 * | 1/2017 | Lee | ................. | H05K 1/148 |
| 2017/0027083 A1 * | 1/2017 | Bai | ................. | H05K 7/20672 |
| 2018/0017798 A1 | 1/2018 | Yoshida | | |
| 2018/0196467 A1 * | 7/2018 | Watamura | ............ | G06F 1/1652 |
| 2018/0284856 A1 * | 10/2018 | Shah | ................. | G06F 1/1616 |
| 2018/0335799 A1 * | 11/2018 | Yamauchi | ............ | G06F 1/1626 |
| 2019/0041922 A1 * | 2/2019 | Kurma Raju | ........ | G06F 1/1637 |
| 2020/0396871 A1 * | 12/2020 | Yun | ................. | H01Q 1/243 |
| 2021/0103317 A1 * | 4/2021 | Raju | ................. | G06F 1/1681 |
| 2022/0369486 A1 * | 11/2022 | Lee | ................. | H05K 9/0079 |

FOREIGN PATENT DOCUMENTS

| | | |
|---|---|---|
| CN | 105794201 A | 7/2016 |
| EP | 2129204 A1 | 12/2009 |
| EP | 3079357 A1 | 10/2016 |
| JP | 2009-283856 A | 12/2009 |
| JP | 2012-028940 A | 2/2012 |
| JP | 2013-041934 A | 2/2013 |
| WO | 2015/083316 A1 | 6/2015 |

* cited by examiner

HEAT CONDUCTION MECHANISM

CROSS REFERENCE TO RELATED APPLICATIONS

This application is a U.S. National Phase of International Patent Application No. PCT/JP2020/018739 filed on May 8, 2020, which claims priority benefit of Japanese Patent Application No. JP 2019-093092 filed in the Japan Patent Office on May 16, 2019. Each of the above-referenced applications is hereby incorporated herein by reference in its entirety.

FIELD

The present disclosure relates to a heat conduction mechanism.

BACKGROUND

For example, various apparatuses such as an imaging apparatus are mounted with various devices that generate heat when being operated. For example, there is a case where an imaging element mounted on an imaging apparatus generates heat when being operated and deteriorates the performance of the imaging apparatus.

Therefore, in apparatuses such as an imaging apparatus, a structure for radiating the heat generated inside the apparatus to the outside is adopted. For example, Patent Literature 1 describes an imaging apparatus including a heat conductive sheet (heat dissipation sheet) that radiates heat generated by an imaging element.

CITATION LIST

Patent Literature

Patent Literature 1: JP 2012-28940 A

SUMMARY

Technical Problem

In general, there are devices in which some constituent members are displaceable with respect to other members. It is considered desirable to implement heat dissipation as described above also in such devices. However, in a case where a heat conductive sheet used for heat dissipation is included in such a device, it is presumed that a portion of the heat conductive sheet that is in contact with a part of a specific member included in the device is worn when the member is displaced.

An imaging apparatus described in Patent Literature 1 is not an imaging apparatus in which it is assumed that each member is displaced to an extent that the heat conductive sheet is worn. Therefore, the technique described in Patent Literature 1 does not consider wear of the heat conductive sheet when a member is displaced.

Therefore, the present disclosure proposes a novel and improved heat conduction mechanism capable of dissipating heat by a heat conductive sheet while suppressing wear of the heat conductive sheet when a member is displaced.

Solution to Problem

According to the present disclosure, a heat conduction mechanism is provided that includes: a first member including at least one heat source; a second member including a heat dissipation element, the second member displaceable with respect to the first member; and a heat conductive sheet that transfers heat of the heat source to the heat dissipation element, wherein a protective sheet is provided to a portion of the heat conductive sheet that can be in contact with at least a part of the first member or the second member.

DESCRIPTION OF EMBODIMENTS

Figure 1:
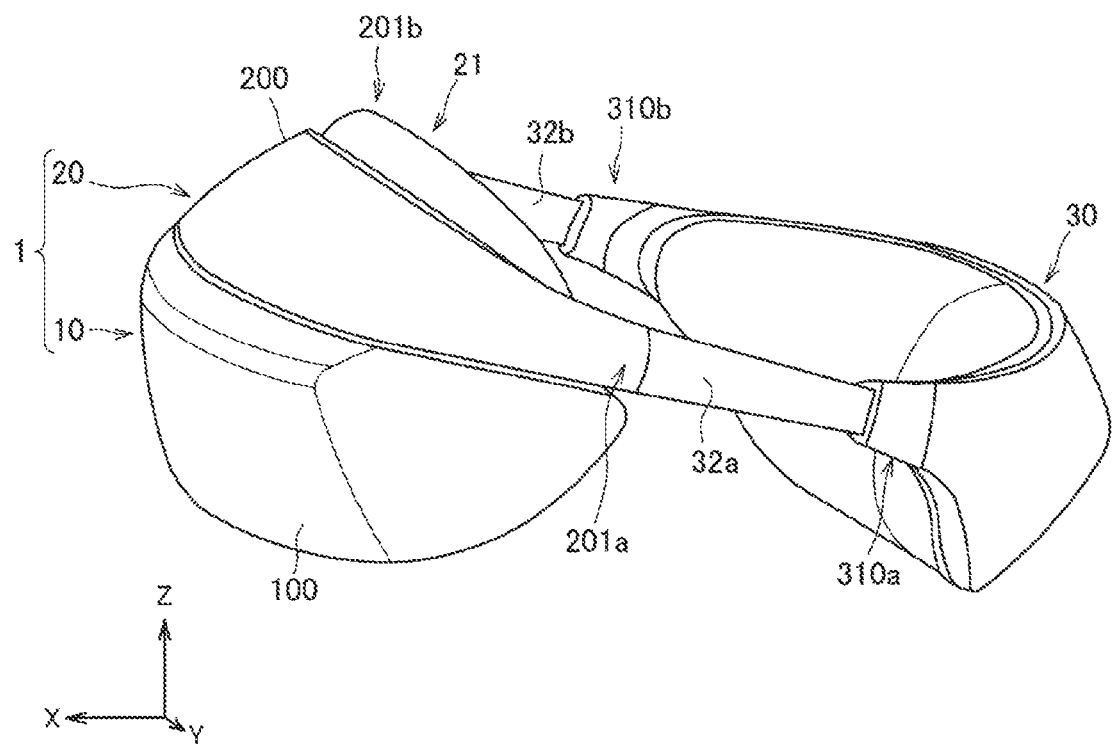
FIG. 1 is an external view illustrating an entire HMD.

Hereinafter, preferred embodiments of the present disclosure will be described in detail by referring to the accompanying drawings. Note that, in the present specification and the drawings, a plurality of components having substantially the same functional configuration may be distinguished by attaching different alphabets after the same reference numeral. For example, a plurality of components having substantially the same functional configuration are distinguished as a camera 118a and a camera 118b as necessary. However, in a case where it is not particularly necessary to distinguish each of a plurality of components having substantially the same functional configuration, only the same reference numeral is attached. For example, in a case where it is not necessary to particularly distinguish between the camera 118a and the camera 118b, they are simply referred to as the cameras 118.

Note that the description will be given in the following order.

1. First Embodiment 1.1. Schematic Configuration of Head Mounted Display
1.2. Structure and Operation of Heat Conduction Mechanism
1.3. Effects
1.4. Modifications 2. Second Embodiment 2.1. Structure and Operation of Heat Conduction Mechanism
2.2. Effects
2.3. Supplement
3. Supplement 1. First Embodiment <1.1. Schematic Configuration of Head Mounted Display>

Figure 2:
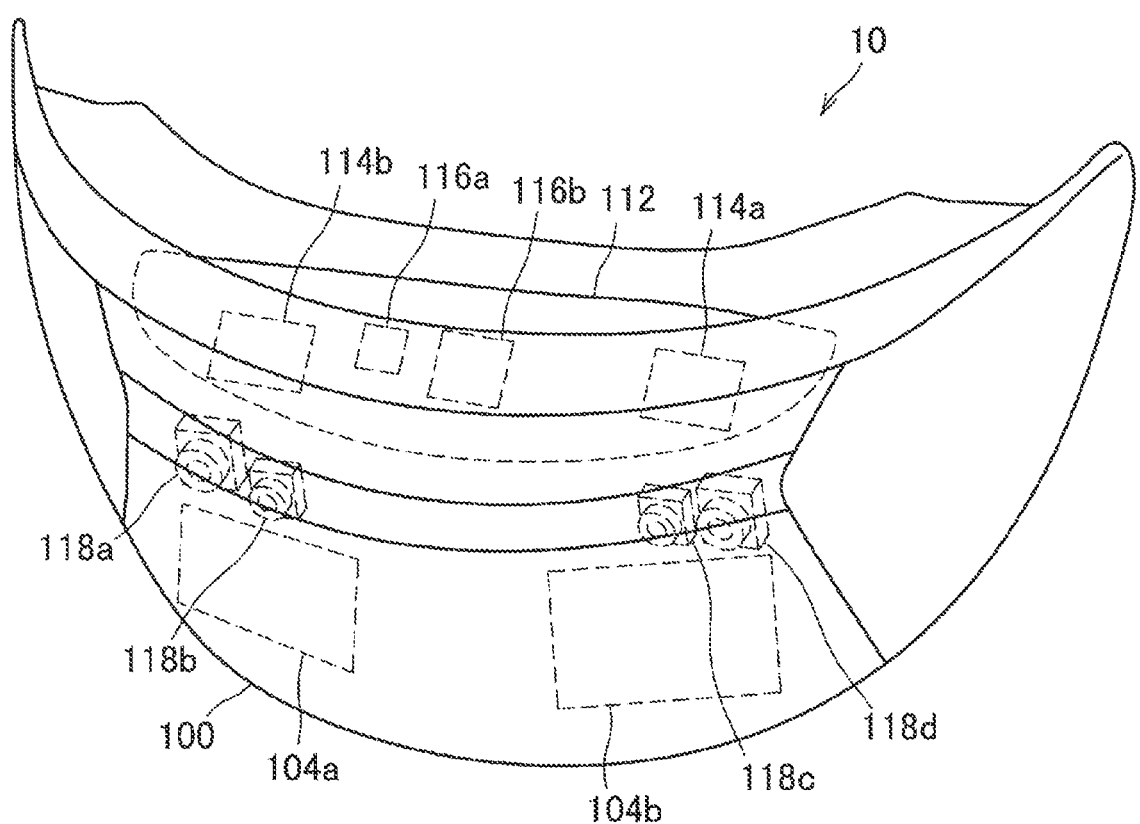
FIG. 2 is a diagram for explaining a heat source of a first member included in a front block included in the HMD.

A heat conduction mechanism according to the present disclosure can be implemented as various stationary display apparatuses (for example, a stationary liquid crystal display apparatus, an organic EL display apparatus, or the like) or can be implemented as a wearable display such as a head mounted display (HMD) 100. In a first embodiment, description will be given on the assumption that a heat conduction mechanism is applied to an HMD 100. First, an outline of the configuration of the HMD 100 according to the first embodiment will be described by referring to FIGS. 1 and 2. FIG. 1 is an external view illustrating the entire HMD 100. FIG. 2 is a diagram for explaining a heat source of a first member 10 included in a front block 1 included in the HMD 100.

As illustrated in FIG. 1, the HMD 100 mainly includes the front block 1, a rear block 30, and coupling members 32. The HMD 100 is mounted on the head of a user with the front block 1, the rear block 30, and the coupling members 32 surrounding the head of the user.

In addition, in the following description, a direction in which the front block 1 and the rear block 30 are arranged in the HMD 100 with the user's head interposed therebetween is referred to as an X axis direction. In this case, in the X axis direction, a direction from the rear block 30 toward the front block 1 is defined as a forward direction of the X axis, and a direction opposite thereto is defined as a backward direction. Furthermore, two directions orthogonal to each other on a plane perpendicular to the X axis direction are referred to as a Y axis direction and a Z axis direction. In this case, the Z axis direction is a direction corresponding to the height of the user.

The front block 1 includes the first member 10, a second member 20, and a head member 21. The first member 10 is positioned in front of the eyes of a user when the HMD 100 is worn by the user and has a function of presenting various images to the user. The first member 10 may include a transmissive display that does not block the user's view in a state where no image is displayed or may include a non-transmissive display.

Furthermore, the first member 10 may be arranged in front of both eyes of the user or may be arranged in front of one eye. The front block 1 may include at least one camera (imaging unit) that captures an image of the surroundings of the user wearing the HMD 100. Meanwhile, a camera mounted on the front block 1 may capture an image of a wide range including a line of sight direction or areas on the sides of the user.

The second member 20 is provided above the first member 10 and includes an exterior member 200 coupled with the rear block 30 by the coupling members 32. Specifically, as illustrated in FIG. 1, a coupling member 32 is coupled with each of a first side end portion 201a which is one of side end portions of the exterior member 200 and a second side end portion 201b which is a side end portion located on the opposite side in the Y axis direction to the first side end portion 201a in the exterior member 200. The head member 21 is provided on the back of the second member 20. When the HMD 100 is mounted on the user's head, the head member 21 comes into contact with the front side of the user's head.

The rear block 30 includes various substrates, a battery, and the like for driving the HMD 100. As described above, the HMD 100 includes heat sources such as various batteries or cameras included in the front block 1 and the rear block 30, and these heat sources generate heat when operated. Therefore, HMDs generate a relatively large amount of heat among various general wearable devices. Therefore, it is considered that HMDs need to efficiently use the surface area of each member included in the HMD 100 to dissipate heat.

The coupling members 32a and 32b have a function of coupling the front block 1 and the rear block 30. As a material of the coupling members 32a and 32b, a metal material, a resin material, or the like can be used, and for example, an aluminum alloy, a titanium alloy, stainless steel, cellulose acetate, polyamide, or the like can be used. As a material of the coupling members 32a and 32b, it is also possible to use a more general resin such as polycarbonate (PC) or ABS.

The coupling members 32a and 32b extend rearward from the first side end portion 201a and the second side end portion 201b, respectively, of the exterior member 200. The coupling member 32a extending rearward from the first side end portion 201a is coupled with a first side end portion 310a of the rear block 30. The coupling member 32b extending rearward from the second side end portion 201b is coupled with a second side end portion 310b located on the opposite side in the Y axis direction to the first side end portion 310a in the rear block 30. Note that the structure of the coupling members 32 is not limited to the above and may be any structure as long as the front block 1 and the rear block 30 can be coupled to each other.

Here, the configuration of the front block 1 will be described in more detail. The front block 1 includes the first member 10 including at least one heat source and the second member 20 displaceable with respect to the first member 10. For example, the second member 20 may be attached to the first member 10 so as to seal the internal space or may be attached to the first member 10 in a state where a part of the internal space communicates with the outside. Note that it is preferable that the second member 20 seals the internal space since entry of dust or the like into the internal space is suppressed.

The first member 10 is displaceable with respect to the second member 20. Specifically, the first member 10 is slidable in the front-back direction of the X axis with respect to the second member 20. For example, in a case where the user wears glasses, it is possible to form a space in which the glasses are accommodated between the eyes of the user and the first member 10 by sliding the first member 10 in the forward direction of the X axis to widen the space between the eyes of the user and the first member 10. Therefore, the user can wear the HMD 100 while wearing the glasses. By sliding the first member 10, it is possible to make the position of the first member 10 to match the shape of the user's face. More specifically, for example, it is possible to make the position of the first member 10 to match with individual differences in the shape of the face such as the height of the nose, how much chiseled, or curves.

Next, the heat source of the first member 10 will be described by referring to FIG. 2. As illustrated in FIG. 2, the first member 10 includes heat sources such as organic light emitting diode (OLED) 114a and OLED 114b, integrated circuit (IC) 116a and IC 116b provided on a substrate 112, and cameras (imaging units) 118a to 118d. The IC 116a and IC 116b mounted on the substrate 112 may be various known ICs such as a field programmable gate array (FPGA). The cameras 118 have a function of capturing an image on the basis of processing by various ICs mounted on the substrate 112. Based on the captured image, an image is displayed on displays (light guide units) 104a and 104b, for example, by the OLEDs (projection unit) 114. As described above, in the HMD 100, main heat sources such as the OLED 114a, the OLED 114b, the IC 116a, the IC 116b, and the cameras 118 are aggregated in the first member 10, and these heat sources generate heat when operated.

Here, a positional relationship between these heat sources will be described. The optical system (the OLED 114a, the OLED 114b, and the displays 104) needs to be in front of the eyes of the user due to the character of the HMD 100. Furthermore, considering the relationship of relative positions of the cameras 118 and the optical system not to be shifted in order to ensure the performance of the HMD 100, it is desirable that the cameras 118 and the optical system be attached to the same member or adjacent members having high rigidity. Accordingly, since various connections (for example, connection between the substrate 112 and the cameras 118, connection between the substrate 112 and the optical system, or the like) are required, the substrate 112 is inevitably installed at a position close to the cameras 118 or the optical system. As described above, in the HMD 100, various heat sources are inevitably aggregated in the first member 10 such as for the above-described connections.

<<1.2. Structure and Operation of Heat Conduction Mechanism>>

Figure 3:
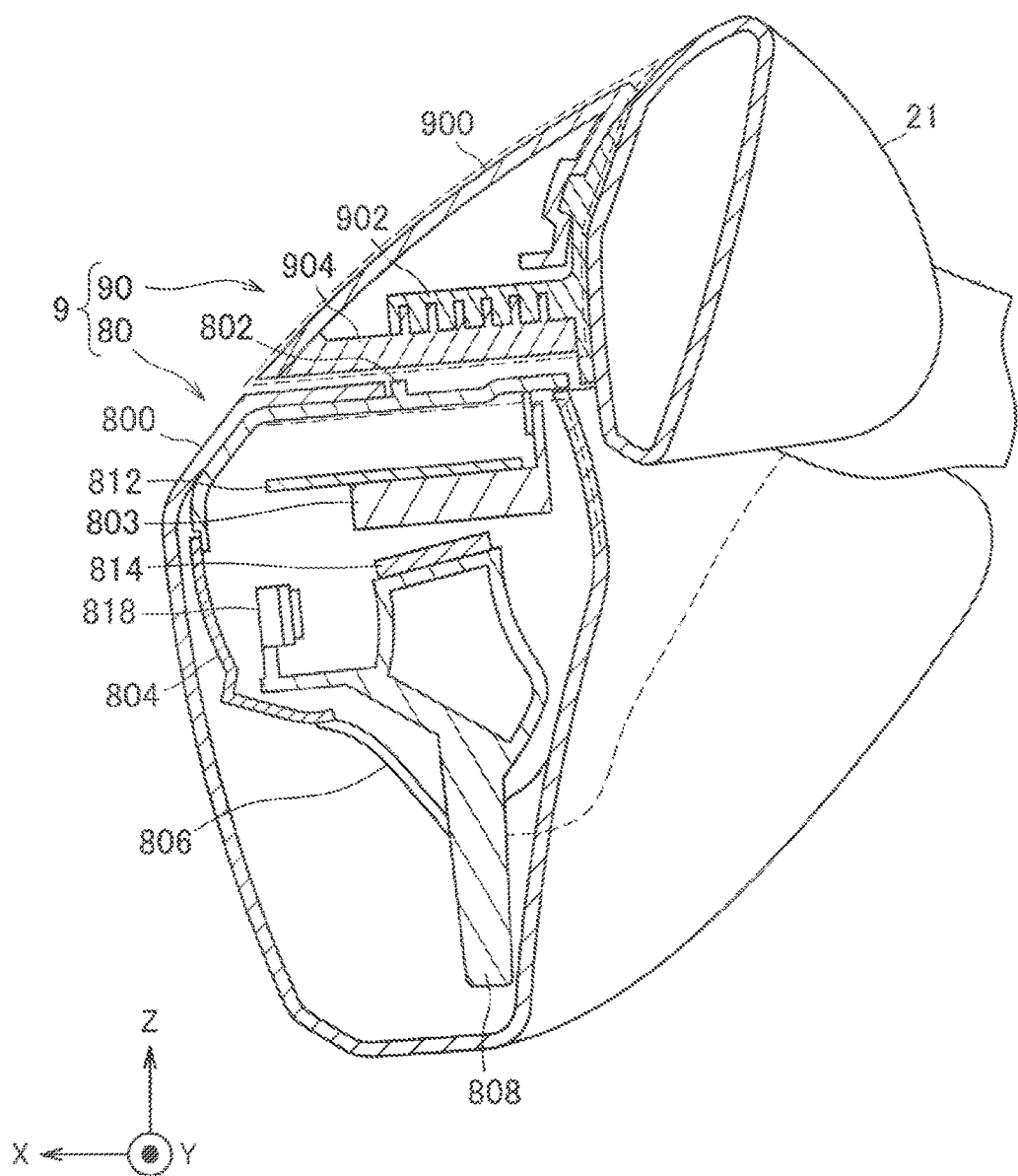
FIG. 3 is a reference diagram illustrating a structure of a heat conduction mechanism to which the technology of the present disclosure is not applied.

Before describing the heat conduction mechanism according to the first embodiment, a heat conduction mechanism 9 to which the technology of the present disclosure is not applied will be described for reference by referring to FIG. 3. Here, features of the internal structure of a general HMD will be described. FIG. 3 is a reference diagram illustrating the structure of the heat conduction mechanism 9 to which the technology of the present disclosure is not applied. The heat conduction mechanism 9 includes a first member 80 and a second member 90. That is, the heat conduction mechanism 9 corresponds to the front block 1. The first member 80 located on the lower side in the heat conduction mechanism 9 mainly includes an external member (visor) 800, various heat sources described above, and an internal structural member. The first member 80 is covered with a transparent external member 800 for protection. In order to protect a camera 818, a display 804, and the like included in the first member 80 from dust, dirt, or the like, it is desirable that the structure of the first member 80 be sealed with the external member 800 as illustrated in FIG. 3. In this case, as illustrated in FIG. 3, the first member 80 has a double structure of the internal structural members and the external member 800.

The internal structural members of the heat conduction mechanism 9 include a first support member 808 that supports the camera 818 and an OLED 814, a second support member 803 that supports a substrate 812, and a third support member 806 that supports various heat sources and members arranged inside the first member 80. Since the internal structural members of the first member 80 are covered by the external member 800, the internal structural members cannot come into contact with the outside air. For this reason, the region that can be used for heat dissipation in the first member 80 is limited on the basis of the arrangement and the structure of each member. A region of the first member 80 that can be exposed to the outside air is, for example, a region indicated by a broken line in the vicinity of the first support member 802. As described above, the region where heat can be dissipated in the first member 80 is narrow considering of the size of the first member 80. Therefore, it is considered that it is difficult to efficiently dissipate the heat generated inside the first member 80 to the outside by the first member 80. Note that, although the first member 80 having as small a size as possible may be excellent in design, the smaller the first member 80 is, the more difficult it is to design the first member 80 that can efficiently dissipate heat.

In the second member 90, an internal space is formed by an exterior member 900, a joining member 902, and a bottom member 904 joined together. Meanwhile, the second member 90 includes no heat sources. The area of the second member 90 in contact with the outside air is larger than the area of the first member 80 that is in contact with the outside air. For example, in the second member 90, the outer side of each member included in the second member 90 (the region indicated by a broken line on the outer circumference of the second member 90) can be in contact with the outside air, and thus heat can be efficiently dissipated. Therefore, it is considered that the second member 90 can dissipate heat in a wider range than the first member 80 can.

In addition, since the first member 80 has a structure capable of sliding in the front-back direction of the X axis, the heat conduction mechanism 9 (that is, the front block) needs to be divided into two members of the first member 80 and the second member 90. In a heat dissipation method that is not shared by the two divided members (the first member 80 and the second member 90), it is necessary to dissipate the heat generated in the first member 80 by the first member 80. Therefore, an area that can actually be used for heat dissipation is small relative to the size of the front block that is visible in the appearance, and it is difficult to efficiently dissipate a large amount of heat generated by the heat sources to the outside.

The features of the configuration of the HMD have been described above. Hereinafter, a heat conduction mechanism capable of implementing more efficient heat dissipation while satisfying the characteristics of the HMD will be described.

Figure 4:
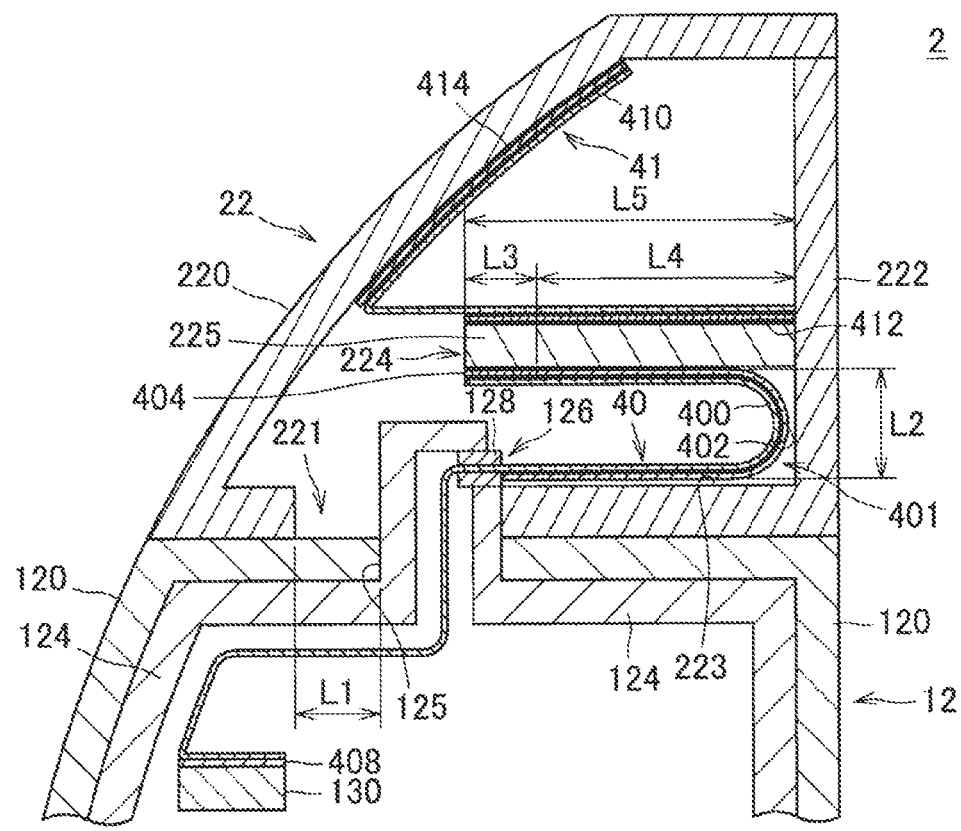
FIG. 4 is a schematic diagram of a heat conduction mechanism according to an embodiment of the present disclosure.
Figure 5:
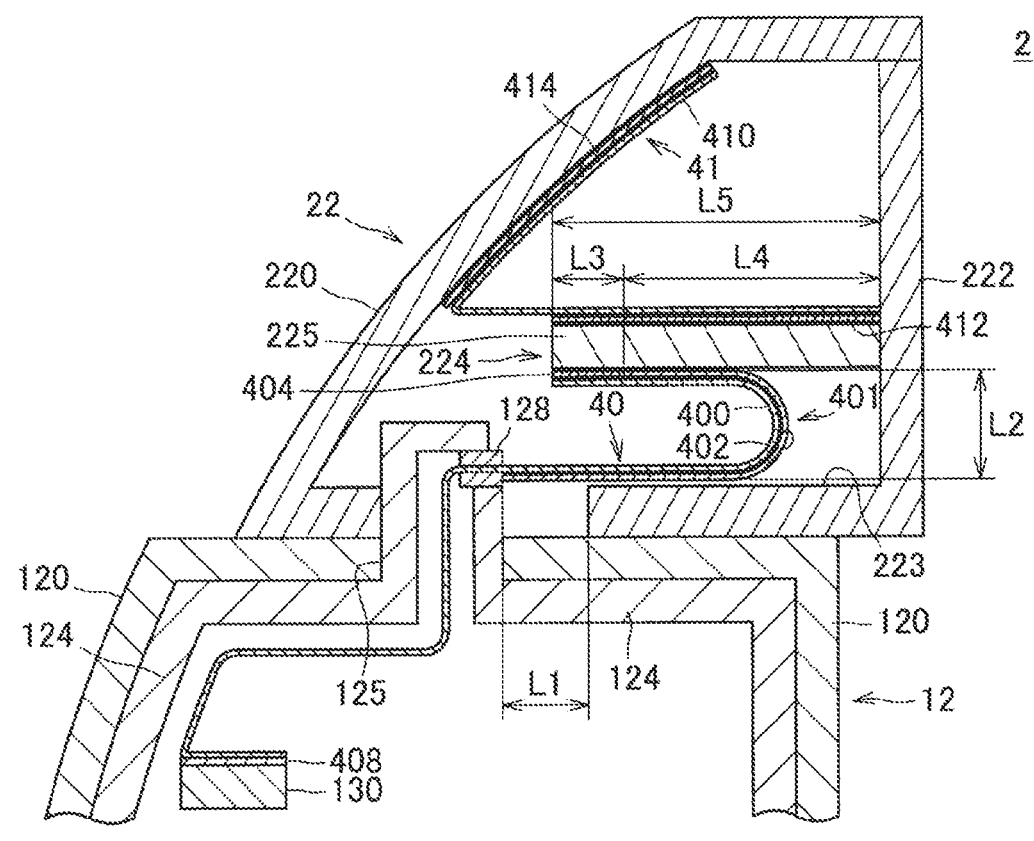
FIG. 5 is a diagram illustrating a state in which the first member included in the heat conduction mechanism according to the embodiment of the present disclosure has slid in a forward direction.
Figure 5:
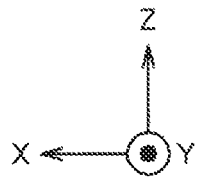
Figure 6:
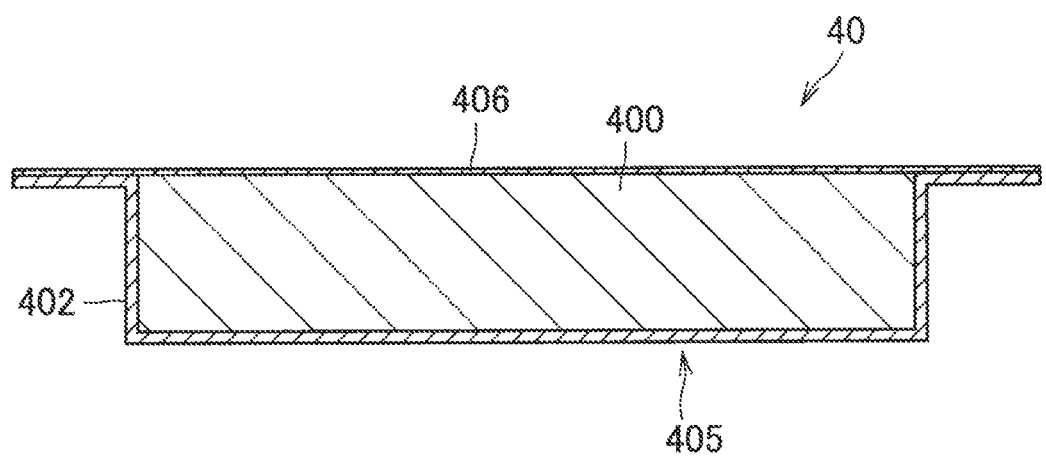
FIG. 6 is a diagram illustrating a cross section perpendicular to the X axis in a sliding portion of a first heat conductive sheet.
Figure 7:
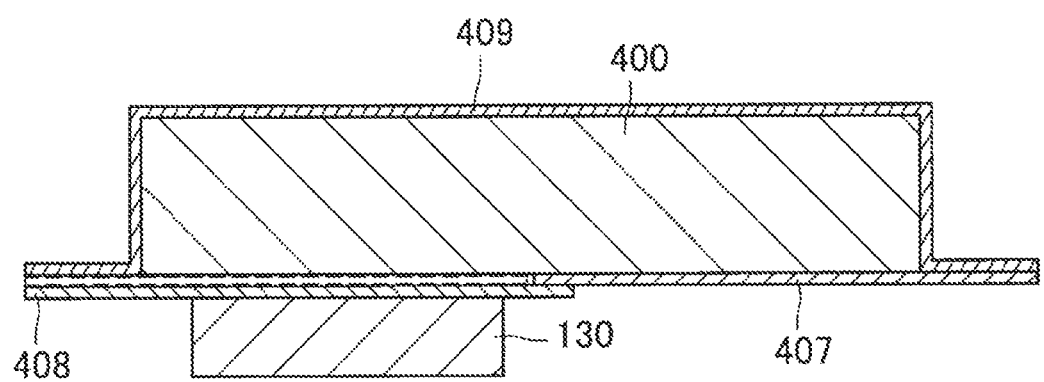
FIG. 7 is a diagram illustrating a cross section perpendicular to the X axis of the first heat conductive sheet fixed to a heat source.

A heat conduction mechanism 2 according to an embodiment of the present disclosure will be described below by referring to FIGS. 4 to 7. FIG. 4 is a schematic diagram of the heat conduction mechanism 2 according to the embodiment of the present disclosure. FIG. 5 is a diagram illustrating a state in which a first member 12 included in the heat conduction mechanism 2 according to the embodiment of the present disclosure has slid in the forward direction. FIG. 6 is a diagram illustrating a cross section perpendicular to the X axis of a sliding portion of a first heat conductive sheet 40. FIG. 7 is a diagram illustrating a cross section perpendicular to the X axis of the first heat conductive sheet 40 fixed to a heat source 130.

The heat conduction mechanism 2 according to the present embodiment includes the first member 12 having at least one heat source 130 and a second member 22, which has a front member (heat dissipation element) 220 and is displaceable with respect to the first member 12, and the first heat conductive sheet 40 and a second heat conductive sheet 41 that transfer heat of the heat source 130 to the front member 220. Note that, in the present specification, displacement of the second member 22 with respect to the first member 12 also means displacement of the first member 12 with respect to the second member 22.

The first heat conductive sheet 40 includes a first graphite sheet 400 and a protective sheet 402. More specifically, in the first heat conductive sheet 40, the protective sheet 402 is provided at a portion that can be in contact with at least a part of the second member 22. The second heat conductive sheet 41 also includes a second graphite sheet 410. Details of the structure of these heat conductive sheets will be described later.

The first member 12 according to the present embodiment can slide in the front-back direction of the X axis with respect to the second member 22. Specifically, in the heat conduction mechanism 2 illustrated in FIG. 4, when the first member 12 is slid in the forward direction of the X axis (that is, the left direction in the drawing), the first member 12 is displaced in the left direction with respect to the second member 22 as illustrated in FIG. 5.

As illustrated in FIG. 4, the first member 12 includes an external member (visor) 120 for protecting the interior of the first member 12, an internal member 124 forming the internal structure of the first member 12, and the heat source 130. The first member 12 has double structures including the external member 120 and the internal member 124. The heat source 130 included in the internal space of the first member 10 may be the camera, various ICs, an OLED, or the like described above. Note that, although only one heat source 130 is illustrated in FIG. 4, the number of heat sources 130 included in the first member 12 may be two or more. In a case where two or more heat sources are arranged, a plurality of first heat conductive sheets 40 and the like may be arranged depending on the number of heat sources.

The second member 22 includes the front member 220, a rear member 222, and an intermediate member 224. With the front member 220 and the rear member 222 joined together, the internal space of the second member 22 is formed. The intermediate member 224 is made of, for example, an aluminum plate or the like and is formed to extend from a part of the rear member 222 toward the forward direction of the X axis. Note that the intermediate member 224 is not limited to the aluminum plate and is only required to be a plate-like member having high thermal conductivity. Specifically, the material of the intermediate member 224 may be copper, magnesium, or the like other than aluminum. Various parts can be disposed in the space above the intermediate member 224 as necessary. Meanwhile, in general, there is a tendency that the shorter a heat transport distance is, the higher the thermal conductivity is. Therefore, the heat conduction mechanism 2 according to the present embodiment is preferable since the thermal conductivity from the first heat conductive sheet 40 to the second heat conductive sheet 41 is increased as the intermediate member 224 is thinner within a range in which the necessary rigidity of the intermediate member 224 is secured. In addition, the second member 22 includes an opening 221 formed by the front member 220 and the rear member 222.

The internal member 124 includes a cylindrical portion 125 formed so as to extend from the internal space of the external member 120 toward the internal space of the second member 22 through the opening 221 of the second member 22. The cylindrical portion 125 has an inner opening 126 that allows the internal space (that is, the internal space of the internal member 124) of the cylindrical portion 125 and the internal space of the second member 22 to be communicated with each other.

Next, the first heat conductive sheet 40 and the second heat conductive sheet 41 according to the first embodiment will be described. In the heat conduction mechanism 2 according to the first embodiment, the first heat conductive sheet 40 and the second heat conductive sheet 41 are included in the internal spaces of the first member 12 and the second member 22 in order to transfer the heat generated by the heat source 130 included in the first member 12 to the second member 22 (more specifically, the front member 220).

One end of the first heat conductive sheet 40 is fixed to the heat source 130 by a fixing member 408. The fixing member 408 may be formed of, for example, an extremely thin (for example, a thickness of about 10 μm or less than 10 μm) double-sided tape or the like. The thermal conductivity from the heat source 130 to the first heat conductive sheet 40 can be enhanced as the thickness of the double-sided tape is thinner. Note that the double-sided tape is not limited to being extremely thin. The thickness of the double-sided tape can be selected as appropriate depending on an adhesive force required for the double-sided tape for bonding the first heat conductive sheet 40 to an object to be bonded (the heat source 130, the intermediate member 224, or the like). Therefore, by making the double-sided tape thicker than 10 μm, the adhesive force can be enhanced. For example, the thickness of the double-sided tape may be, for example, 30 μm, 50 μm, 100 μm, or 200 μm. Note that although the adhesive force is improved as the double-sided tape is thicker, the thermal conductivity between the object to be bonded and the first heat conductive sheet 40 is impaired. For example, thermal conductivity from the heat source 130 to the first heat conductive sheet 40 is impaired. As the material of the double-sided tape, a material having high thermal conductivity may be used other than materials that are generally used. The thickness and the material to be adopted for the double-sided tape are examined and determined as appropriate when a product such as the HMD is designed. Note that each fixing member described below may also be formed of an extremely thin double-sided tape or the like or may be formed of a double-sided tape having a thickness of more than 10 μm. The first heat conductive sheet 40 passes through the inner opening 126 of the cylindrical portion 125 and is exposed to the outside of the first member 12. More specifically, the first heat conductive sheet 40 passes through the inner opening 126 of the cylindrical portion 125 and is inserted into the internal space of the second member 22.

Moreover, the first heat conductive sheet 40 is fixed in the inner opening 126 of the cylindrical portion 125 by a sealing member 128. The sealing member 128 seals the inner opening 126 of the cylindrical portion 125 and thereby prevents entry of dust or the like in the internal space of second member 22 into the internal space of the first member 12. The sealing member 128 may be structured as to clamp the first heat conductive sheet 40 with, for example, a urethane-based cushion material. An end portion of the first heat conductive sheet 40 on the opposite side to the heat source 130 is fixed to the intermediate member 224 by a fixing member 404. More specifically, the first heat conductive sheet 40 is fixed to an end portion 225 of the intermediate member 224. Therefore, the first heat conductive sheet 40 is movable as the first member 12 slides.

The second heat conductive sheet 41 is fixed to the intermediate member 224 by a fixing member 412. Furthermore, the second heat conductive sheet 41 is fixed to at least a part of the front member 220, more specifically, to an inclined portion of the front member 220 by a fixing member 414.

Here, a mechanism of heat dissipation by the first heat conductive sheet 40 and the second heat conductive sheet 41 included in the heat conduction mechanism 2 will be described. When the first heat conductive sheet 40 receives heat from the heat source 130 included in the internal space of the first member 12, the heat is transferred to the second heat conductive sheet 41 via the intermediate member 224. The second heat conductive sheet 41 transfers the heat transferred from the intermediate member 224 to the front member 220. The front member 220 dissipates the heat received from the second heat conductive sheet 41 to the outside. Therefore, the front member 220 has a function as a heat dissipation element that dissipates the heat of the heat source 130 to the outside. In this manner, the heat conduction mechanism 2 according to the first embodiment can dissipate the heat of the heat source 130 included in the first member 12 to the outside air via the first heat conductive sheet 40, the second heat conductive sheet 41, and the front member (heat dissipation element) 220.

Hereinafter, the structures of the first heat conductive sheet 40 and the second heat conductive sheet 41 according to the first embodiment will be described in more detail. The area where the first heat conductive sheet 40 is fixed to the intermediate member 224 contributes to thermal conductivity to the second heat conductive sheet 41.

Specifically, as the area is larger, thermal conductivity from the first heat conductive sheet 40 to the second heat conductive sheet 41 is improved. In addition, the thermal conductivity is improved as the area where the second heat conductive sheet 41 is attached to the intermediate member 224 and the area where the second heat conductive sheet 41 is attached to the front member 220 are both as larger as possible. Furthermore, the thermal conductivity is improved and the heat dissipation efficiency is improved as these areas are as wider as possible also in the positive and negative directions of the Y axis.

The first heat conductive sheet 40 slides together with the first member 12 as the first member 12 slides. More specifically, the first heat conductive sheet 40 can slide in the front-back direction of the X axis by distance L1 between the left end of the cylindrical portion 125 and the left end of the opening 221 at the maximum. In order to implement this sliding, the first heat conductive sheet 40 needs an extra length portion that allows the first heat conductive sheet 40 to slide in the internal space of the second member 22.

In the first embodiment, the first heat conductive sheet 40 has a portion that can be in contact with a part of the second member 22. More specifically, the first heat conductive sheet 40 can be in contact with the rear member 222 and the intermediate member 224. The structure of a portion of the first heat conductive sheet 40 that can be in contact with these members will be described later.

In the first embodiment, the first heat conductive sheet 40 slides on at least a part of the second member 22 in the internal space of the second member 22 as the first member 12 slides. More specifically, the first heat conductive sheet 40 slides on at least a part of a bottom portion 223 of the rear member 222 in a space (hereinafter also referred to as a "sliding space") defined by the rear member 222 and the intermediate member 224 in the internal space of the second member 22. Therefore, since the range in which the first heat conductive sheet 40 moves is defined by a plane on which the first heat conductive sheet 40 slides, the first heat conductive sheet 40 is prevented from moving in an unintended direction.

The first heat conductive sheet 40 according to the first embodiment has a curved portion 401 in the sliding space and slides in a state of being curved in a U shape. Note that, in the present specification, a U shape is not limited to a case where portions of the first heat conductive sheet 40 facing each other are parallel but also includes a state in which they are shifted from the parallel state. As described above, in the first embodiment, since the first heat conductive sheet 40 is curved in the sliding space, the first heat conductive sheet 40 fits inside the second member 22 in a compact shape. Here, the size of the sliding space is not particularly limited, but the length L2 of the sliding space in the Z axis direction may be, for example, a length that allows the first heat conductive sheet 40 to be curved in a U shape and to move smoothly. Furthermore, the length L4 of the sliding space in the X axis direction may be a length expressed by a sum of a half (L1/2) of a sliding length of the first member 12, a half (L2/2) of a radius of the curved portion 401, and an appropriate margin amount.

A portion of the first heat conductive sheet 40 accommodated in the sliding space corresponds to an extra length portion for allowing the first heat conductive sheet 40 to slide and is required not to be fixed to a member or the like but to be freely movable. The length L2 of the sliding space in the Z axis direction can be increased within a range where the extra length portion is secured. Note that it is preferable that a portion of the first heat conductive sheet 40 other than that in the sliding space is fixed. If the first heat conductive sheet 40 is not fixed in a space other than the sliding space, there is a possibility that a portion other than the portion of the first heat conductive sheet 40, which is intended to move, moves in the internal space of the first member 12 or the second member 22, which may hinder implementation of the intended operation.

The heat conduction mechanism 2 according to the first embodiment includes two sheets of the first heat conductive sheet 40 and the second heat conductive sheet 41 instead of one heat conductive sheet. This is a structure in consideration of workability of the heat conductive sheets and the ease of assembly of the heat conduction mechanism 2. When only the thermal conductivity is considered, it is ideal that one heat conductive sheet is continuously connected from the heat source 130 to the front member 220. However, in this case, the heat conductive sheet becomes quite long, and there are cases where processing for preparing the heat conductive sheet is difficult. Further, at the time of assembling the second member 22 (for example, when the front member 220 and the rear member 222 are joined to each other), it is necessary to perform assembling work in a state where a long heat conductive sheet is always fixed to the second member 22 or the like, and it is considered that workability is significantly deteriorated. In the first embodiment, the heat conductive sheet is divided into two, and the first heat conductive sheet 40 is fixed to the end portion 225 of the intermediate member 224. Therefore, when the front member 220 is coupled with the rear member 222, since the first heat conductive sheet 40 is fixed, the workability of the coupling is improved.

The first heat conductive sheet 40 and the second heat conductive sheet 41 are each attached to one of both sides of the intermediate member 224. Since the intermediate member 224 is made of a material having high thermal conductivity such as aluminum, the heat of the first heat conductive sheet 40 can be transferred to the second heat conductive sheet 41 with high efficiency. In this manner, in the first embodiment, the thermal resistance generated between the first heat conductive sheet 40 and the second heat conductive sheet 41 is reduced.

In the present embodiment, the protective sheet 402 is provided at a portion of the first heat conductive sheet 40 that can be in contact with a part of the second member 22. For example, in the second member 22, the protective sheet 402 is provided at a portion that may come into contact with the intermediate member 224. The protective sheet 402 may be made of, for example, a polyethylene terephthalate (PET) sheet. In general, a graphite sheet is brittle and may be worn by operation such as sliding and peeled off into powder. A portion of the first heat conductive sheet 40 that can come into contact with the intermediate member 224 comes into contact with or separates from the intermediate member 224 as the first member 12 slides. At this time, wear of a portion of the first heat conductive sheet 40 that can come into contact with the intermediate member 224 is suppressed by the protective sheet 402.

In addition, the first graphite sheet 400 has conductivity. With the protective sheet 402 attached to the surface of the first graphite sheet 400, the first graphite sheet 400 and other members (for example, the rear member 222) are prevented from electric conduction. Although not illustrated in FIG. 4, an ultrathin film (for example, a PET sheet having a thickness of about 10 μm or less than 10 μm) made of, for example, PET or the like may be attached as necessary to a region of the first graphite sheet 400 where the protective sheet 402 is not attached. As a result, wear or electric conduction of the first graphite sheet 400 is suppressed. Note that, hereinafter, an ultrathin film is also simply referred to as a "film".

In the first embodiment, the first heat conductive sheet 40 may also be in contact with the rear member 222. Furthermore, the first heat conductive sheet 40 slides on the bottom portion 223 of the rear member 222 as the first member 12 slides. The protective sheet 402 is attached also to the sliding plane of the first heat conductive sheet 40. This prevents the first graphite sheet 400 from being worn when the first heat conductive sheet 40 slides on the bottom portion 223 of the rear member 222.

Next, the structure of the sliding portion of the first heat conductive sheet 40 will be described in more detail by referring to FIG. 6. As illustrated in FIG. 6, the protective sheet 402 is attached to a lower plane (that is, a sliding plane 405 that slides on the bottom portion 223) of the first graphite sheet 400, and a film 406 is attached to an upper plane of the first graphite sheet 400.

In the first embodiment, a graphite sheet is used as a thin material having excellent thermal conductivity in a planar direction that forms the first heat conductive sheet 40 and the second heat conductive sheet 41. Therefore, the first heat conductive sheet 40 and the second heat conductive sheet 41 have high thermal conductivity and can transfer heat with high efficiency. However, a copper foil, an aluminum foil, or the like can be used instead of the graphite sheet depending on the application as long as the material is thin and has high thermal conductivity. Normally, a graphite sheet is often used with a film attached thereto in order to protect or insulate a surface thereof. However, in order to use the first heat conductive sheet 40 while the first heat conductive sheet 40 is sliding as in the present embodiment, elasticity is insufficient if it is only the film, and it is conceivable that various problems may occur. For example, there are a possibility that transmission of force when the first heat conductive sheet 40 is slid is insufficient, a possibility that the first heat conductive sheet 40 is bent and warped at an unintended position due to the first heat conductive sheet 40 being twisted inside each member, and a possibility that the first heat conductive sheet 40 is worn when the first heat conductive sheet 40 repeats sliding.

Therefore, in the present embodiment, a PET sheet thicker than the film 406 is used as the protective sheet 402 for the sliding plane 405. As a result, the elasticity of the first heat conductive sheet 40 increases, thereby improving the stability of the movement of the first heat conductive sheet 40 during sliding of the first member 12, and the durability of the first heat conductive sheet 40 is also improved. The thickness of the PET sheet included in the protective sheet 402 is preferably greater than or equal to 10 μm. As a result, resistance to sliding of the first heat conductive sheet 40 can be further improved. Furthermore, as the PET sheet is thicker, the durability of the first heat conductive sheet 40 is improved. For example, in the design study of the heat conduction mechanism 2, thicknesses such as 50 μm, 100 μm, or 200 μm can be selected, and needless to say, thicknesses other than these thicknesses can also be selected. At this time, a material having a thickness having elasticity and durability for satisfying the purpose is selected for the protective sheet 402. Note that, as materials of the protective sheet 402 and the film, PC, polyimide, or the like can also be used other than PET depending on the application.

By imparting elasticity to the first heat conductive sheet 40, the operation (sliding operation) of the portion of the first heat conductive sheet 40 fixed by the sealing member 128 is accurately transmitted to the first heat conductive sheet 40, and the shape of the curved portion 401 is stabilized by the elastic force of the protective sheet 402. In the first embodiment, not the protective sheet 402 but the film 406 is attached to a side of the first graphite sheet 400 opposite to the protective sheet 402 so that the curving characteristic of the first heat conductive sheet 40 is not impaired. In a case where a hard material, a thick material, or the like is attached to both sides of the first graphite sheet 400, wrinkles or folds may occur in the first heat conductive sheet 40 at the curved portion 401. There are cases where the first heat conductive sheet 40 cannot stably function when the generated shapes (wrinkles, folds) become permanent.

Next, the structure of the first heat conductive sheet 40 in the vicinity of the heat source 130 will be described by referring to FIG. 7. In order to improve heat transfer efficiency, it is preferable that a film 407 is not attached to a portion (a portion indicated by a broken line) where the first graphite sheet 400 is fixed to the heat source 130 by the fixing member 408 and that the first graphite sheet 400 and the heat source 130 are directly fixed to each other. However, there are cases where the first graphite sheet 400 and the heat source 130 cannot be directly fixed to each other for reasons such as processing of various members such as the first member 12. In this case, for example, a film may be attached to the broken line portion, and the first graphite sheet 400 may be fixed to the heat source 130 via the film. Note that the film 409 may be attached to a side of the first graphite sheet 400 opposite to the heat source 130 to prevent electric conduction and to improve durability.

Note that the layers of the first graphite sheet 400 used for the first heat conductive sheet 40 and the second graphite sheet 410 used for the second heat conductive sheet 41 may be a single layer or laminated layers. However, if the number of these laminated graphite sheets is excessively increased in order to improve the heat transfer efficiency, the thickness of the heat conductive sheet increases, and there are cases where the curving characteristic of the heat conductive sheet is impaired. Therefore, the number of laminated sheets is appropriately designed depending on the size of a space (sliding space) in which a space for storing the extra length portion of the first heat conductive sheet 40 can be accommodated, the thickness of the graphite sheet per sheet, the thickness of the double-sided tape between layers of the graphite sheet, and the like.

Next, referring back to FIG. 4, the range in which the first heat conductive sheet 40 includes the protective sheet 402 will be described in more detail. As illustrated in FIG. 4, the protective sheet 402 is attached to the first heat conductive sheet 40 positioned in the sliding space. More specifically, in the sliding space, the protective sheet 402 is attached to the outer side (that is, the side on which the first heat conductive sheet 40 slides on the rear member 222) of the first graphite sheet 400 in the curved portion 401, and the film is attached to the inner side.

The first heat conductive sheet 40 slides together with the first member 12 as the first member 12 slides. At this time, the protective sheet 402 attached to the first graphite sheet 400 located inside the second member 22 slides on the bottom portion 223 of the rear member 222 in the sliding space. When the first member 12 is sliding, the protective sheet 402 of first heat conductive sheet 40 slides on the bottom portion 223 of the rear member 222. In this case, since the first graphite sheet 400 is protected by the protective sheet 402, resistance to sliding (that is, surface strength and durability) of the first heat conductive sheet 40 is improved. In addition, since the protective sheet 402 is not attached to the inner side of the curved portion 401 of the first heat conductive sheet 40, wrinkles, folds, or the like is less likely to occur in the first heat conductive sheet 40. Therefore, in the first heat conductive sheet 40, good durability and stable operability are both achieved.

Furthermore, a part of the first heat conductive sheet 40 comes into contact with or separates from the intermediate member 224 as the first member 12 slides. As a result, there is a possibility that a portion of the first heat conductive sheet 40 that may come into contact with the intermediate member 224 is also worn. In the first embodiment, the protective sheet 402 is attached also to a portion of the first heat conductive sheet 40 that is in contact with the intermediate member 224. As a result, the first heat conductive sheet 40 has resistance (surface strength, durability) also at a portion that is in contact with the intermediate member 224.

Note that it is not necessary to attach the protective sheet 402 other than the range of the protective sheet 402 illustrated in FIG. 4. On the other hand, since the range of the protective sheet 402 illustrated in FIG. 4 is a portion that may come into contact with the intermediate member 224 or the rear member 222 at the time of sliding, the protective sheet 402 needs to be attached. In particular, if the protective sheet 402 is not attached to the sliding portion of the first heat conductive sheet 40, the first graphite sheet 400 slides on the bottom portion 223 and wears.

Furthermore, in the second heat conductive sheet 41, the protective sheet may not be attached to the entire area. For example, only a film may be attached to both sides of the second graphite sheet 410. In particular, in the second heat conductive sheet 41, it is preferable that a film as thin as possible is attached to a portion fixed to the front member 220 by the fixing member 414 since it is easier to attach the second heat conductive sheet 41 in close contact with the curved surface of the front member 220. It is also preferable that a film as thin as possible is attached to a bent portion at the lower end of the second heat conductive sheet 41 that is fixed by the fixing member 414 since the film can be bent smoothly.

In addition, a protective sheet may be attached to a region other than the range to which the protective sheet 402 is attached in the first heat conductive sheet 40 and the entire region of the second heat conductive sheet 41 for manufacturing reasons or for the purpose of protecting these heat conductive sheets. In the development of the heat conduction mechanism of the present disclosure, the protection range by the protective sheet may be expanded in a case where a plurality of portions of the heat conductive sheet slide, a case where a portion other than a portion that is in contact with the heat conductive sheet is protected, or the like.

In the first embodiment, the second heat conductive sheet 41 is disposed in a relatively wide space in the internal space of the second member 22. Therefore, the second heat conductive sheet 41 is less limited with respect to the thickness of the second graphite sheet 410. For this reason, a laminated graphite sheet can be used as the second graphite sheet 410 as long as the number of layers is within a range in which the members of the heat conduction mechanism 2 can be processed or assembled.

<<1.3. Effects>>

The structure and operation of the heat conduction mechanism 2 according to one embodiment of the present disclosure have been described above. Here, effects of the heat conduction mechanism 2 according to the first embodiment will be described. In the heat conduction mechanism 2 according to the first embodiment, the first heat conductive sheet 40 and the second heat conductive sheet 41 transfer the heat of the heat source 130 of the first member 12 to the front member 220 of the second member 22. As a result, the heat of the heat source 130 is dissipated to the outside. As a result, it is possible to suppress the temperature rise of various heat sources 130 mounted on the first member 12. As a result, it is possible to suppress the temperature rise in various heat sources 130 such as the cameras, the OLEDs, or the ICs mounted on the first member 12.

In the first heat conductive sheet 40, the protective sheet 402 is provided at a portion of the first heat conductive sheet 40 that can be in contact with the rear member 222 of the second member 22 and the intermediate member 224. Therefore, it is possible to dissipate heat by the first heat conductive sheet 40 and the second heat conductive sheet 41 while suppressing wear of the first heat conductive sheet 40 when the first member 12 is displaced with respect to the second member 22.

Furthermore, the first heat conductive sheet 40 slides on a part of the second member 22 (specifically, the bottom portion 223 of the rear member 222) as the first member 12 is displaced (slides) with respect to the second member 22. Since the protective sheet 402 is provided at a portion where the first heat conductive sheet 40 slides, wear of the first heat conductive sheet 40 due to sliding is suppressed. As described above, according to the heat conduction mechanism 2 of the first embodiment, it is possible to suppress wear of the first heat conductive sheet 40 due to sliding while dissipating the heat of the heat source 130 to the outside.

In the first embodiment, two heat conductive sheets (the first heat conductive sheet 40 and the second heat conductive sheet 41) are each fixed to the intermediate member 224. Since the heat conduction mechanism 2 according to the first embodiment has such a structure, the ease of assembly of the second member 22 is improved. In addition, since the inner opening 126 that allows the first member 12 and the second member 22 to communicate with each other is sealed by the sealing member 128, entry of dust, dirt, or the like present in the internal space of the second member 22 into the inside of the first member 12 is suppressed.

As described above, in the heat conduction mechanism 2 according to the first embodiment, in the first member 12 and the second member 22 that can be displaced from each other, heat dissipation across the two members is achieved while the ease of assembly or sealability are ensured.

<1.4. Modifications>

Hereinafter, three modifications of the heat conduction mechanism 2 according to the above embodiment will be described. In heat conduction mechanisms according to the modifications, the structures of a heat conductive sheet and a second member are different from the structures of the heat conductive sheets and the second member 22 according to the above embodiment, and thus this point will be mainly described.

(First Modification)

Figure 8:
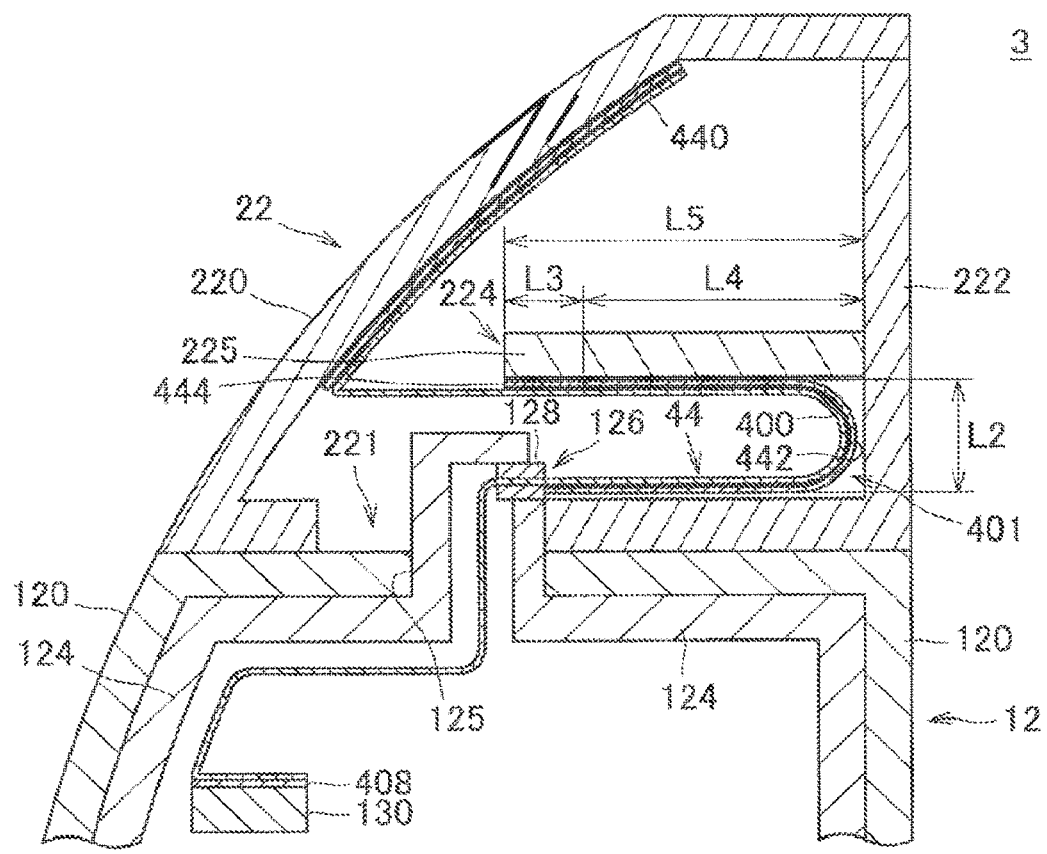
FIG. 8 is a schematic diagram of a heat conduction mechanism according to a first modification.

In a first modification, unlike the above embodiment, one heat conductive sheet 44 is included in a heat conduction mechanism 3. The structure of the heat conduction mechanism 3 according to the first modification will be described by referring to FIG. 8. FIG. 8 is a schematic diagram of the heat conduction mechanism 3 according to the first modification.

Similarly to the heat conduction mechanism 2 according to the above embodiment, the heat conduction mechanism 3 according to the first modification includes a first member 12 and a second member 22. However, the heat conductive sheet 44 according to the first modification is a single sheet. One end of the heat conductive sheet 44 is fixed to the heat source 130 present in the internal space of an internal member 124 by a fixing member 408. The heat conductive sheet 44 passes through an inner opening 126 of a cylindrical portion 125 from the internal space of the internal member 124 and is inserted into the internal space of the second member 22. The heat conductive sheet 44 has a curved portion 441 curved in a U shape in the sliding space and is fixed to a front member 220 by a fixing member 444. Furthermore, the middle of the heat conductive sheet 44 is fixed by a sealing member 128 at the inner opening 126 of the cylindrical portion 125 and is fixed to an intermediate member 224 by the fixing member 444. Therefore, the range in which the heat conductive sheet 44 slides is controlled, and unintended operation of the heat conductive sheet 44 is suppressed.

Also in the heat conductive sheet 44 according to the first modification, a protective sheet 442 is attached to a portion where a graphite sheet 440 slides as the first member 12 slides and a portion that can be in contact with the intermediate member 224 and the like. As a result, wear of the heat conductive sheet 44 is suppressed.

Furthermore, since the heat conductive sheet 44 according to the first modification is formed of one sheet, thermal resistance generated between the first heat conductive sheet 40 and the second heat conductive sheet 41 as in the above embodiment does not occur, and thus heat conduction with higher efficiency can be achieved.

Note that, in the heat conduction mechanism 3 according to the first modification, it is not necessary to transfer the heat via the intermediate member 224. Therefore, the material of the intermediate member 224 is not required to have high thermal conductivity and may be various materials such as resin.

(Second Modification)

Figure 9:
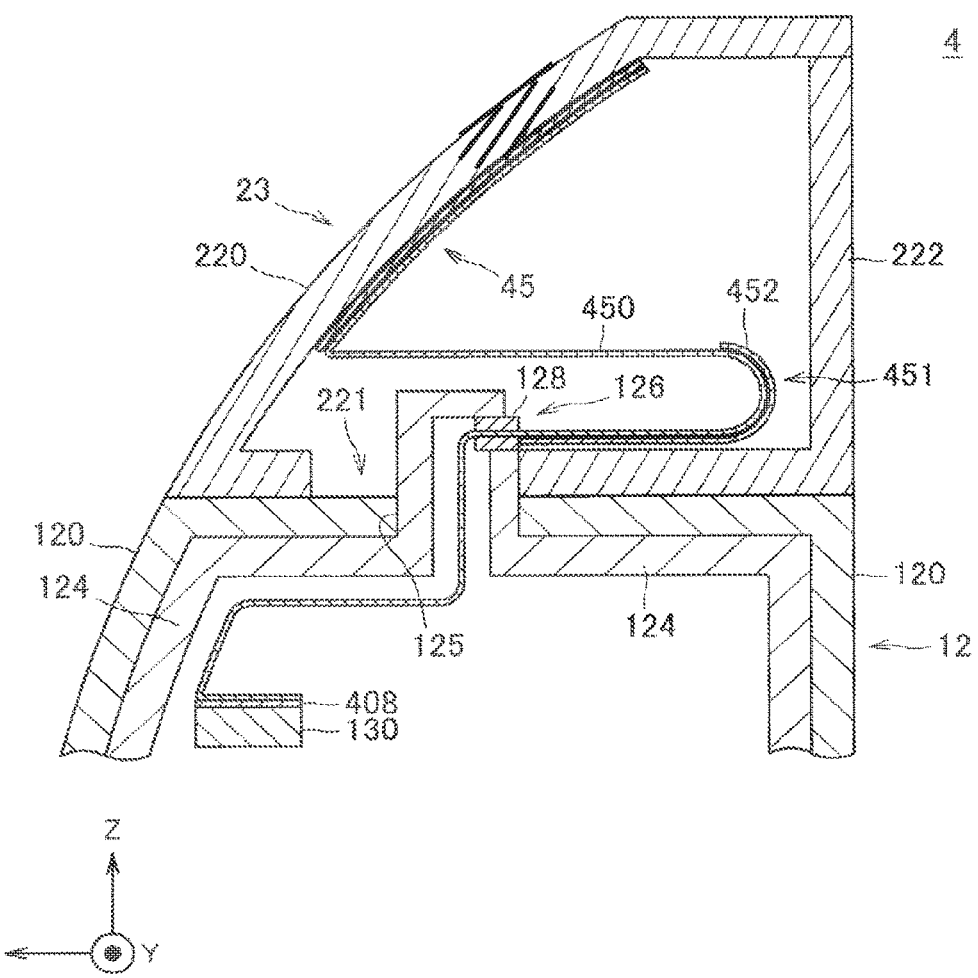
FIG. 9 is a schematic diagram of a heat conduction mechanism according to a second modification.

Next, the structure of a heat conduction mechanism 4 according to a second modification will be described by referring to FIG. 9. FIG. 9 is a schematic diagram of the heat conduction mechanism 4 according to the second modification. As illustrated in FIG. 9, the structure of the heat conduction mechanism 4 according to the second modification has a structure in which the intermediate member 224 is removed from the structure of the heat conduction mechanism 3 according to the first modification in a second member 23. That is, a heat conductive sheet 45 according to the second modification is different from the heat conductive sheet 44 according to the first modification in that the heat conductive sheet 45 is not fixed to the intermediate member.

In the heat conduction mechanism 4 according to the second modification, since there is no intermediate member, the number of parts included in the heat conduction mechanism 4 can be reduced on a condition that a sufficient space that does not interfere with the operation of the heat conductive sheet 45 is secured inside a second member 22.

Furthermore, when a first member 12 slides in the left direction, a portion around a curved portion 451 of the heat conductive sheet 45 is drawn in the downward direction. For this reason, the surface on which the heat conductive sheet 45 slides during sliding needs to be protected by a protective sheet 452. The length of a graphite sheet 450 that needs to be protected is affected by how an extra length portion is determined (length, shape, or the like) in a state before the first member 12 slides, the structure of an opening 221, or the like. However, it is desirable that the length of the graphite sheet 450 that needs to be protected is at least equal to or longer than the sum of the length of the portion of the heat conductive sheet 45 that is already in contact with a rear member 222 or the like before sliding (that is, the first member 12 is positioned at the right end), the sliding amount, and a margin. As described above, also in the second modification, with the protective sheet 452 provided at the sliding portion of the heat conductive sheet 45, it is possible to dissipate the heat of a heat source 130 to the outside while suppressing wear of the heat conductive sheet 45 due to sliding.

Note that, in the heat conduction mechanism 4 according to the second modification, the heat conductive sheet 45 is not fixed in the internal space of the second member 23 except for a front member 220. Therefore, the heat conductive sheet 45 according to the second modification has a wider movable range than the heat conductive sheet 44 according to the first modification does. For this reason, there needs to be a space of a sufficient size for allowing the heat conductive sheet 45 according to the second modification to move inside the second member 22.

(Third Modification)

Figure 10:
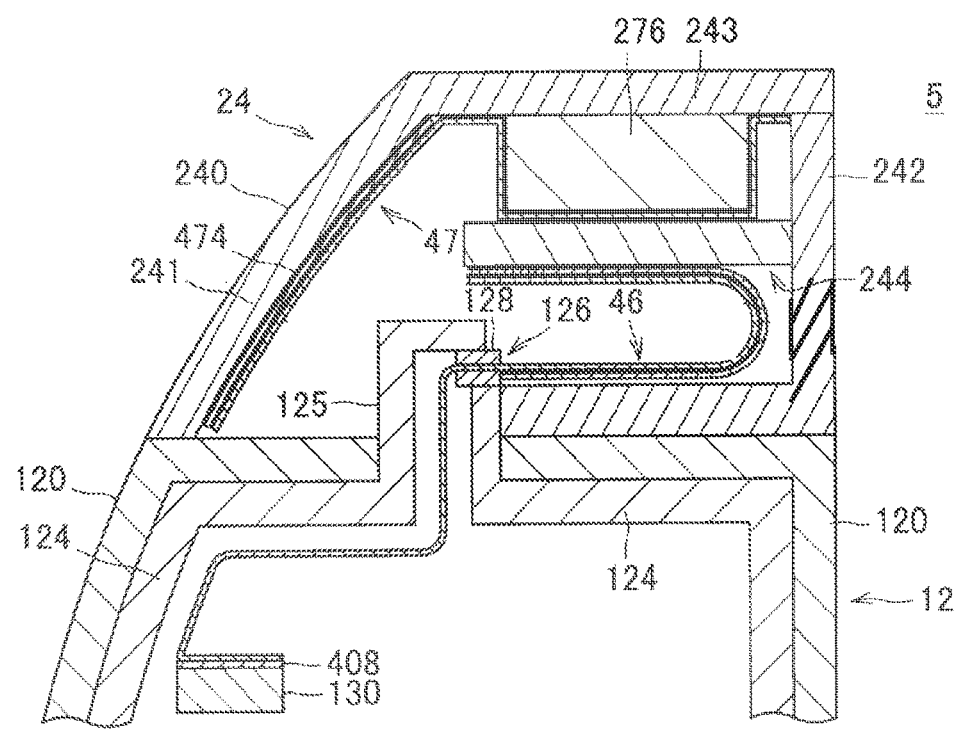
FIG. 10 is a schematic diagram of a heat conduction mechanism according to a third modification.

Next, a heat conduction mechanism 5 according to a third modification will be described by referring to FIG. 10. FIG. 10 is a schematic diagram of the heat conduction mechanism 5 according to the third modification. In the heat conduction mechanism 5 according to the third modification, a front member (third member) 240 included in a second member 24 is separable from a rear member (fourth member) 242. Therefore, in the heat conduction mechanism 5 according to the third modification, the front member 240 can be detached from the rear member 242. Since the structures of a first member 12 and a first heat conductive sheet 46 according to the third modification are substantially the same as the structures of the first member 12 and the first heat conductive sheet 40 illustrated in FIG. 4, the description thereof is omitted here.

An elastic body 276 is provided on a lower plane of a ceiling portion 243 of the front member 240 according to the third modification. A second heat conductive sheet 47 is fixed to an inclined portion 241 of the front member 240 by a fixing member 474. Furthermore, the second heat conductive sheet 47 is in contact with the elastic body 276 in a state of being fixed to the front member 240. When the front member 240 is coupled to the rear member 242, the second heat conductive sheet 47 is pressed by the elastic body 276 and thereby directly abuts on an intermediate member 244. As a result, the second heat conductive sheet 47 is in close contact with the intermediate member 244, and the heat of the first heat conductive sheet 46 is transferred to the second heat conductive sheet 47 via the intermediate member 244.

As described above, the technology according to the present disclosure can be applied even in a case where a part of the heat conduction mechanism is separable. In addition, as in the heat conduction mechanism 5 according to the third modification, by providing the elastic body 276 to the front member 240 and bringing the second heat conductive sheet 47 into contact with the intermediate member 244, heat can be transferred from the first heat conductive sheet 46 to the second heat conductive sheet 47. As described above, the technology according to the present disclosure can be applied to a heat conduction mechanism having various structures including the heat conduction mechanism 5 that is separable.

Note that, in the third modification, it has been described that the front member 240 can be completely separated from the rear member 242. Even in a case where the front member 240 can be opened and closed with respect to the rear member 242, the technique according to the third modification can be applied.

2. Second Embodiment

<<2.1. Structure and Operation of Heat Conduction Mechanism>>

Figure 11:
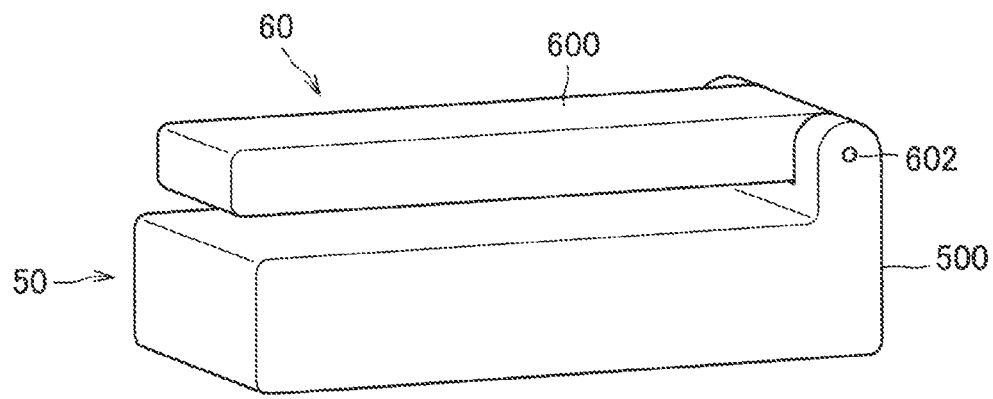
FIG. 11 is a diagram illustrating the appearance of a heat conduction mechanism according to a second embodiment.
Figure 12:
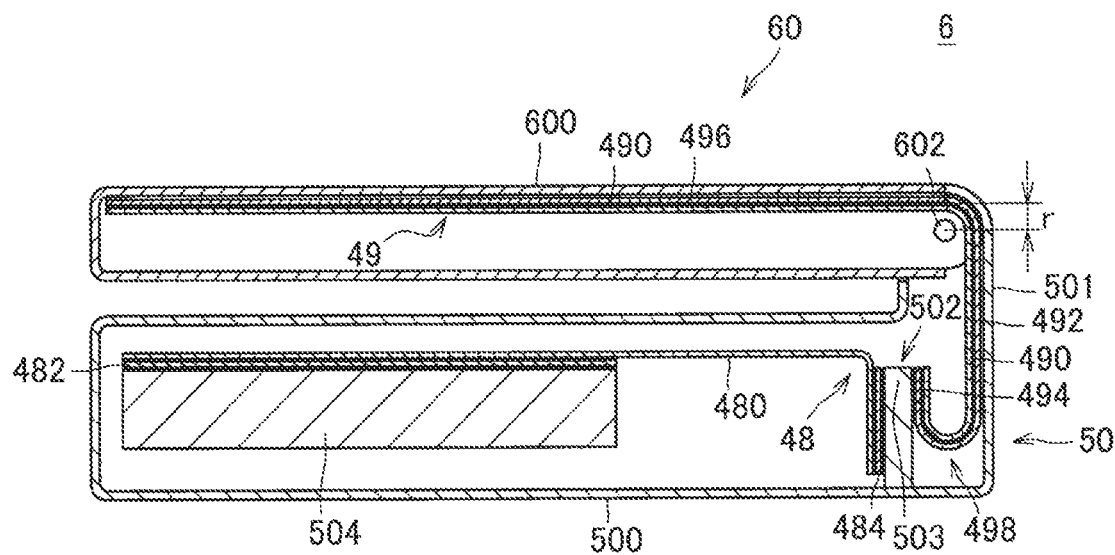
FIG. 12 is a diagram illustrating the structure of the heat conduction mechanism according to the second embodiment.
Figure 13:
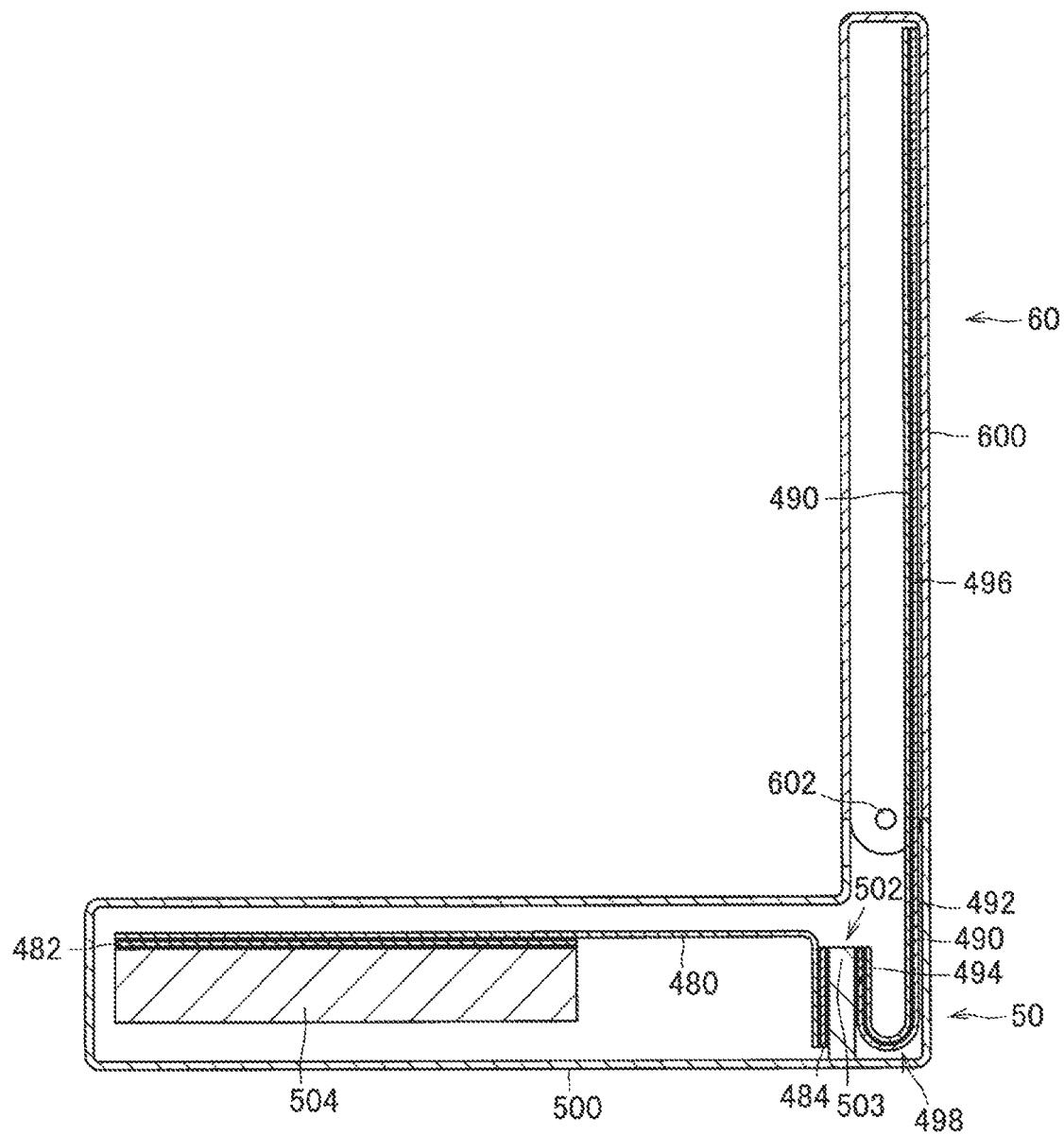
FIG. 13 is a diagram illustrating a state in which a second member is rotated clockwise by 90° with respect to a first member in the heat conduction mechanism according to the second embodiment.

The heat conduction mechanism described in the above embodiment is a mechanism in which the first member 12 slides with respect to the second member. The technology according to the present disclosure can be applied to mechanisms other than heat conduction mechanisms having a sliding mechanism. For example, the technology according to the present disclosure can also be applied to a heat conduction mechanism 6 according to a second embodiment having a mechanism in which a specific member rotates with respect to another member. Hereinafter, the structure of the heat conduction mechanism 6 according to the second embodiment will be described by referring to FIGS. 11 to 13. FIG. 11 is a diagram illustrating the appearance of the heat conduction mechanism 6 according to the second embodiment. FIG. 12 is a diagram illustrating the structure of the heat conduction mechanism 6 according to the second embodiment. FIG. 13 is a diagram illustrating a state in which a second member 60 is rotated clockwise by 90° with respect to a first member 50 in the heat conduction mechanism 6 according to the second embodiment.

As illustrated in FIG. 11, the heat conduction mechanism 6 according to the second embodiment includes the first member 50 and the second member 60 that are rotatably coupled with each other. More specifically, as illustrated in FIG. 12, the heat conduction mechanism 6 according to the second embodiment includes the first member 50 having a heat source 504, the second member 60 having a second wall portion (heat dissipation element) 600 and being displaceable with respect to the first member 50, and first and second heat conductive sheets 48 and 49 that transfer the heat of the heat source 504 to the second wall portion 600. The first member 50 and the second member 60 are rotatably coupled with each other by a rotation shaft 602. As described above, the heat conduction mechanism 6 according to the second embodiment has a hinge structure in which the second member 60 is rotatable with respect to the first member 50.

The first member 50 mainly includes a first wall portion 500, an intermediate member 502, and the heat source 504. The first wall portion 500 is a member forming the outer circumference of the first member 50. The intermediate member 502 is formed to extend from a part of the first wall portion 500 toward the inside of the first member 50. The second member 60 includes the second wall portion 600 and the rotation shaft 602. The second wall portion 600 is a member forming the outer circumference of the second member 60.

The heat conduction mechanism 6 according to the second embodiment includes two heat conductive sheets of the first heat conductive sheet 48 and the second heat conductive sheet 49. The first heat conductive sheet 48 includes a first graphite sheet 480. The film may be attached to both sides of the first graphite sheet 480 within a necessary range. A part of the first heat conductive sheet 48 is fixed to the heat source 504 by a fixing member 482. An end portion of the first heat conductive sheet 48 on the opposite side to the heat source 504 is fixed to the intermediate member 502 by a fixing member 484.

The second heat conductive sheet 49 includes a second graphite sheet 490 and a protective sheet 492 attached to a part of the second graphite sheet 490. Specifically, in the second heat conductive sheet 49, the protective sheet 492 is provided at a portion that can be in contact with the intermediate member 502 and the first wall portion 500 included in the first member 50. Although not illustrated in FIG. 12, a film may be attached to a portion of the second graphite sheet 490 to which the protective sheet 492 is not attached within a necessary range. One end of the second heat conductive sheet 49 is fixed to an end portion 503 of the intermediate member 502 by a fixing member 494. A portion of the second heat conductive sheet 49 on the opposite side to the portion fixed to the intermediate member 502 is fixed to a part of the inside of the second wall portion 600 by a fixing member 496.

In the heat conduction mechanism 6 according to the second embodiment, the first heat conductive sheet 48 receives heat from the heat source 504 and transfers the heat to the intermediate member 502. The intermediate member 502 transfers the heat of the first heat conductive sheet 48 to the second heat conductive sheet 49. Furthermore, the second heat conductive sheet 49 transfers the heat received from the intermediate member 502 to the second wall portion 600, and the heat is dissipated to the outside air. In this manner, in the heat conduction mechanism 6 according to the second embodiment, the heat of the heat source 504 is dissipated to the outside.

In the heat conduction mechanism 6 according to the second embodiment, the second heat conductive sheet 49 slides when the second member 60 rotates with respect to the first member 50. More specifically, when the second member 60 rotates, a U-shaped curved portion 498 of the second heat conductive sheet 49 expands and contracts, and a part of the second heat conductive sheet 49 slides on the inside of a right side wall 501 of the first wall portion 500 along with the expansion or contraction.

Here, the length of the portion where the second heat conductive sheet 49 slides will be described. The distance from the center of the rotation shaft 602 to the second graphite sheet 490 is defined as r. The length of the portion where the second heat conductive sheet 49 slides when the second member 60 rotates is the sum of the length of a portion where the second heat conductive sheet 49 is in contact with the first wall portion 500 in a state before operation (that is, the state illustrated in FIG. 12) and the length of expansion or contraction of the second heat conductive sheet 49. Here, the length of expansion or contraction is represented by a product of (rotation angle of the second member 60 [° ]/360) and (2πr). It can be said that the length of expansion or contraction corresponds to the sliding amount in the heat conduction mechanism having the sliding mechanism of the above embodiment. For example, in a case where the second member 60 rotates by 90°, the length of expansion or contraction is πr/2. Furthermore, the range in which the second heat conductive sheet 49 should be protected by the protective sheet 492 is a range obtained by adding a portion where the second heat conductive sheet 49 is in contact with the first wall portion 500 in a state before operation, a length by which the second heat conductive sheet 49 expands or contracts, and a margin.

<<2.2. Effects>>

In the second heat conductive sheet 49 according to the second embodiment, the protective sheet 492 is attached to a portion that can be in contact with the first wall portion 500 of the first member 50 or the intermediate member 502. More specifically, the protective sheet 492 is attached to a portion of the second graphite sheet 490 from the U-shaped curved portion 498 to the vicinity of the periphery of the rotation shaft 602. As a result, the second heat conductive sheet 49 can be in contact with each member and slide while being protected by the protective sheet 492, and thus wear of the second heat conductive sheet 49 is suppressed.

As described above, according to the heat conduction mechanism 6 of the second embodiment, even in the heat conduction mechanism having the structure in which the second member 60 is rotatable with respect to the first member 50, it is possible to dissipate the heat of the heat source while suppressing wear of the heat conductive sheet.

<<2.3. Supplement>>

The heat conduction mechanism 6 according to the second embodiment can be used in, for example, a glasses-type HMD. Specifically, the heat conduction mechanism 6 according to the second embodiment can be applied using the first member 50 as an eyeglass display and the second member 60 as an eyeglass frame. In this case, the heat source 504 may be, for example, various known devices for displaying an image on the display.

Here, supplementary explanation is given to the heat conduction mechanism 6 according to the second embodiment. The heat conduction mechanism 6 according to the second embodiment dissipates the heat of the heat source 504 to the outside using the first heat conductive sheet 48 and the second heat conductive sheet 49. Without being limited to the above, a heat conduction mechanism having a hinge mechanism as in the heat conduction mechanism 6 according to the second embodiment may also have a mechanism capable of dissipating heat with one heat conductive sheet as in the heat conduction mechanism 3 according to the first modification. In this case, one end of the heat conductive sheet may be fixed to the heat source 504, and the other end of the heat conductive sheet may be fixed to a part of the second wall portion 600 of the second member 60. As a result, the heat transfer efficiency can be enhanced. In this case, the middle of the heat conductive sheet may be further fixed to a part (for example, in FIG. 12, a portion to which the second heat conductive sheet 49 is fixed) of the intermediate member 502. As a result, a range in which the heat conductive sheet moves is defined, and unintended operation of the heat conductive sheet is suppressed.

In addition, a heat conduction mechanism having a hinge mechanism, as in the heat conduction mechanism 6 according to the second embodiment, may also have a mechanism capable of dissipating heat with one heat conductive sheet without including the intermediate member 502 as in the third embodiment. In this case, the number of parts included in the heat conduction mechanism can be reduced.

<3. Supplement>

Although the preferred embodiments of the present disclosure have been described in detail by referring to the accompanying drawings, the technical scope of the present disclosure is not limited to such examples. It is obvious that a person having ordinary knowledge in the technical field of the present disclosure can conceive various modifications or variations within the scope of the technical idea described in the claims, and it is naturally understood that these also belong to the technical scope of the present disclosure.

For example, in the above embodiments, the heat conduction mechanisms used for HMDs have been mainly described, however, the present technology is not limited to such examples. The technology of the present disclosure can be applied to various devices, members, or the like including two members that can be displaced from each other.

Furthermore, the effects described in the present specification are merely illustrative or exemplary and are not restrictive. That is, the technology according to the present disclosure can exhibit other effects that are obvious to those skilled in the art from the description of the present specification together with or instead of the above effects.

Note that the following structures also belong to the technical scope of the present disclosure.

(1)

A heat conduction mechanism comprising:

a first member including at least one heat source;

a second member including a heat dissipation element, the second member displaceable with respect to the first member; and a heat conductive sheet that transfers heat of the heat source to the heat dissipation element, wherein a protective sheet is provided to a portion of the heat conductive sheet that can be in contact with at least a part of the first member or the second member.

(2)

The heat conduction mechanism according to (1), wherein at least a part of the portion that can be in contact slides on at least a part of the first member or the second member depending on displacement of the second member with respect to the first member, and the protective sheet is provided to at least a part of the portion that slides.

(3)

The heat conduction mechanism according to (1) or (2), wherein at least one of the first member or the second member includes, in an internal space, an intermediate member to which at least a part of the heat conductive sheet is fixed.

(4)

The heat conduction mechanism according to (3), wherein the heat conductive sheet includes:

a first heat conductive sheet fixed to the heat source and the intermediate member; and a second heat conductive sheet fixed to the intermediate member and the heat dissipation element.

(5)

The heat conduction mechanism according to (4), wherein the intermediate member transfers heat of the first heat conductive sheet to the second heat conductive sheet.

(6)

The heat conduction mechanism according to (4) or (5), wherein the first heat conductive sheet is fixed to an end portion of the intermediate member.

(7)

The heat conduction mechanism according to any one of (4) to (6), further comprising:
an elastic body that brings the second heat conductive sheet into contact with at least a part of the intermediate member.

(8)

The heat conduction mechanism according to (7), wherein the second member includes: a third member including the intermediate member; and a fourth member including the elastic body,
the fourth member is separable from the third member, and
the elastic body brings the second heat conductive sheet into contact with at least a part of the intermediate member in a state where the third member is coupled with the fourth member.

(9)

The heat conduction mechanism according to any one of (3) to (8),
wherein the heat conductive sheet is curved in a space defined by at least one of the first member or the second member and the intermediate member.

(10)

The heat conduction mechanism according to any one of (1) to (9), further comprising:
a sealing member that seals an opening while fixing the heat conductive sheet,
wherein the heat conductive sheet passes through the opening formed in the first member from the heat source and is exposed to an outside of the first member.

(11)

The heat conduction mechanism according to any one of (1) to (10),
wherein the first member is displaced by sliding or rotating with respect to the second member.

(12)

The heat conduction mechanism according to any one of (1) to (11),
wherein the protective sheet includes a PET sheet.

(13)

The heat conduction mechanism according to (12), wherein the PET sheet has a thickness greater than or equal to 10 μm.

(14)

The heat conduction mechanism according to any one of (1) to (13),
wherein the heat conductive sheet includes a graphite sheet.

(15)

The heat conduction mechanism according to any one of (1) to (14), further comprising:
a light guide unit arranged in front of an eye of a user; and a projection unit that projects an image on the light guide unit.

(16)

The heat conduction mechanism according to any one of (1) to (15), further comprising:
an imaging unit that captures an image,
wherein the heat source includes the imaging unit.

REFERENCE SIGNS LIST 2, 3, 4, 5, 6 Heat Conduction Mechanism
10, 12, 50 First Member
20, 22, 23, 24, 60 Second Member
40, 46, 48 First Heat Conductive Sheet
41, 47, 49 Second Heat Conductive Sheet
44, 45 Heat Conductive Sheet
104 Display
114 Oled
116 IC
118 Camera
124 Internal Member
126 Inner Opening
128 Sealing Member
130, 504 Heat Source
200 Exterior Member
220, 240 Front Member
222, 242 Rear Member
223 Bottom Portion
224, 244, 502 Intermediate Member
225, 503 End Portion
276 Elastic Body
401, 451 Curved Portion
402, 424, 452, 492 Protective Sheet
405 Sliding Plane
406, 407, 409, 426 Film
400, 480 First Graphite Sheet
410, 490 Second Graphite Sheet
440, 450 Graphite Sheet
441, 498 Curved Portion
500 First Wall Portion
600 Second Wall Portion
602 Rotation Shaft

The invention claimed is:

1. A heat conduction mechanism, comprising:
a first member including at least one heat source;
a second member including a heat dissipation element, a third member, and a fourth member, wherein
the second member is displaceable with respect to the first member,
the third member includes an intermediate member,
the fourth member includes an elastic body, and
the fourth member is separable from the third member; and
a heat conductive sheet configured to transfer heat of the at least one heat source to the heat dissipation element, wherein
the heat conductive sheet includes:
a protective sheet at a portion of the heat conductive sheet that is contactable with at least a part of one of the first member or the second member,
a first heat conductive sheet fixed to the at least one heat source and the intermediate member; and
a second heat conductive sheet fixed to the intermediate member and the heat dissipation element, and
the elastic body is configured to bring the second heat conductive sheet into contact with at least a part of the intermediate member in a state where the third member is coupled with the fourth member.

2. The heat conduction mechanism according to claim 1, wherein
   at least a part of the portion of the heat conductive sheet is configured to slide on at least a part of one of the first member or the second member based on displacement of the second member with respect to the first member, and
   the protective sheet is at a part of the portion that slides.

3. The heat conduction mechanism according to claim 1, wherein the intermediate member is configured to transfer heat of the first heat conductive sheet to the second heat conductive sheet.

4. The heat conduction mechanism according to claim 1, wherein the first heat conductive sheet is fixed to an end portion of the intermediate member.

5. The heat conduction mechanism according to claim 1, wherein the heat conductive sheet is curved in a space defined by at least one of the first member or the second member and the intermediate member.

6. The heat conduction mechanism according to claim 1, further comprising
   a sealing member that seals an opening while fixing the heat conductive sheet, wherein the heat conductive sheet passes through the opening formed in the first member from the at least one heat source and is exposed to an outside of the first member.

7. The heat conduction mechanism according to claim 1, wherein the first member is displaced by sliding or rotating with respect to the second member.

8. The heat conduction mechanism according to claim 1, wherein the protective sheet includes a PET sheet.

9. The heat conduction mechanism according to claim 8, wherein the PET sheet has a thickness greater than or equal to 10 µm.

10. The heat conduction mechanism according to claim 1, wherein the heat conductive sheet includes a graphite sheet.

11. The heat conduction mechanism according to claim 1, further comprising:
    a light guide unit in front of an eye of a user; and
    a projection unit configured to project an image on the light guide unit.

12. The heat conduction mechanism according to claim 1, further comprising
    an imaging unit configured to capture an image, wherein the at least one heat source includes the imaging unit.

13. A heat conduction mechanism, comprising:
    a first member including at least one heat source;
    a second member including a heat dissipation element, wherein the second member is displaceable with respect to the first member;
    a heat conductive sheet configured to transfer heat of the at least one heat source to the heat dissipation element, wherein the heat conductive sheet includes a protective sheet at a portion of the heat conductive sheet that is contactable with at least a part of one of the first member or the second member;
    a light guide unit in front of an eye of a user; and
    a projection unit configured to project an image on the light guide unit.

\* \* \* \* \*